US012785627B2

(12) United States Patent
Su

(10) Patent No.: US 12,785,627 B2
(45) Date of Patent: Nov. 3, 2026

(54) INDUCTOR CURRENT RECONSTRUCTION CIRCUIT, CONTROLLER AND SWITCHED-MODE POWER SUPPLY

(71) Applicant: SHANGHAI BRIGHT POWER SEMICONDUCTOR CO., LTD., Shanghai (CN)

(72) Inventor: Xiaohua Su, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 589 days.

(21) Appl. No.: 18/458,659

(22) Filed: Aug. 30, 2023

(65) Prior Publication Data

US 2024/0097618 A1 Mar. 21, 2024

(30) Foreign Application Priority Data

Sep. 16, 2022 (CN) ......................... 202211129178.7

(51) Int. Cl.
*H03F 1/02* (2006.01)
*H02M 1/00* (2007.01)
(Continued)

(52) U.S. Cl.
CPC ........ *H03F 1/0233* (2013.01); *H02M 1/0009* (2021.05); *H02M 1/088* (2013.01);
(Continued)

(58) Field of Classification Search
CPC ............... H03F 1/0233; H03F 3/45183; H03F 3/45273; H03F 2203/45674;
(Continued)

(56) References Cited

U.S. PATENT DOCUMENTS

2014/0103898 A1* 4/2014 Shrivastava ........ H02M 3/1563 323/311
2022/0294330 A1* 9/2022 Huang ................ H02M 1/0009

FOREIGN PATENT DOCUMENTS

CN 100414828 C * 8/2008 ........ H02M 3/33507
CN 108696124 B * 9/2022 ........... H03K 17/166
JP H10215580 A * 8/1998 ............. H05B 41/28

* cited by examiner

*Primary Examiner* — Andrea Lindgren Baltzell
*Assistant Examiner* — Lance Torbjorn Bartol
(74) *Attorney, Agent, or Firm* — MUNCY, GEISSLER, OLDS & LOWE, P.C.

(57) ABSTRACT

An inductor current reconstruction circuit, a controller and a switched-mode power supply are disclosed. The inductor current reconstruction circuit includes an AC component reconstruction module having a charge/discharge capacitor, which is coupled to an inductor and configured to charge or discharge the charge/discharge capacitor, based on voltage difference between voltages at opposing ends of the inductor, or on voltage difference between a voltage at one end of the inductor and another voltage associated with the voltage at the end of the inductor, at a current proportional to the voltage difference. The AC component reconstruction module outputs a reconstructed signal characterizing an AC component in a current through the inductor. Inductor current reconstruction can be achieved without detecting ON/OFF states of power transistors. This makes the precision of inductor current reconstruction immune from influence of both any voltage drop across power transistors and simultaneous turn-off of upper and lower power transistors.

16 Claims, 5 Drawing Sheets

(51) Int. Cl.
*H02M 1/088* (2006.01)
*H02M 3/158* (2006.01)
*H03F 3/45* (2006.01)

(52) U.S. Cl.
CPC ........ *H02M 3/158* (2013.01); *H03F 3/45183* (2013.01); *H03F 3/45273* (2013.01); *H03F 2200/15* (2013.01); *H03F 2203/45674* (2013.01)

(58) Field of Classification Search
CPC ... H03F 2200/15; H02M 1/088; H02M 3/158; H02M 1/0009
USPC .......................................................... 330/129
See application file for complete search history.

INDUCTOR CURRENT RECONSTRUCTION CIRCUIT, CONTROLLER AND SWITCHED-MODE POWER SUPPLY

CROSS-REFERENCES TO RELATED APPLICATIONS

This application claims the priority of Chinese patent application number 202211129178.7, filed on Sep. 16, 2022, the entire contents of which are incorporated herein by reference.

TECHNICAL FIELD

The present invention relates to the field of electrical and electronic technologies and, in particular, to an inductor current reconstruction circuit, a controller and a switched-mode power supply.

BACKGROUND

For switched-mode power supplies, inductor current detection is critical to their control and protection. In order to meet the demand for switched-mode power supplies with higher switching frequencies and faster response, more and more switched-mode power supplies have begun using a reconstructed inductor current for their control and protection.

However, existing inductor current reconstruction designs are associated with a number of problems, such as reduced reconstructed current precision, as well as in some circumstances, inaccurate reconstructed currents and reconstructed current accuracy affected by a voltage drop across a power transistor.

SUMMARY OF THE INVENTION

It is an objective of the present invention to provide an inductor current reconstruction circuit, a controller and a switched-mode power supply, which are capable of reconstructing a more precise inductor current.

To this end, the present invention provides an inductor current reconstruction circuit, including an AC component reconstruction module having a charge/discharge capacitor, the AC component reconstruction module coupled to an inductor and configured to charge or discharge the charge/discharge capacitor, based on a voltage difference between voltages at opposing ends of the inductor, or on a voltage difference between a voltage at a first end of the inductor and another voltage associated with the voltage at the first end of the inductor, a current of charging or discharging the charge/discharge capacitor proportional to the voltage difference, the AC component reconstruction module outputting a reconstructed signal characterizing an AC component in a current through the inductor.

Optionally, the AC component reconstruction module may also have a first operational amplifier and a current-controlled current source, a first input terminal of the first operational amplifier coupled to the first end of the inductor and receiving the voltage at the first end of the inductor, a second input terminal of the first operational amplifier receiving the voltage at the second end of the inductor, or the other voltage associated with the voltage at the first end of the inductor, or a predefined voltage, an output terminal of the first operational amplifier coupled to a control terminal of the current-controlled current source, a first terminal of the current-controlled current source coupled to the first end of the inductor, a second terminal of the current-controlled current source coupled to a first end of the charge/discharge capacitor and serving as an output terminal of the AC component reconstruction module, the reconstructed signal is output from the output terminal of the AC component reconstruction module, a second end of the charge/discharge capacitor being grounded, wherein the first operational amplifier generates, based on the voltage difference between the voltages at the first and second ends of the inductor, or on the voltage difference between the voltage at the first end of the inductor and the other voltage associated with the voltage at the first end of the inductor, a corresponding control signal for controlling the magnitude of a charge current or a discharge current provided by the current-controlled current source to the charge/discharge capacitor.

Optionally, the second input terminal of the first operational amplifier may be coupled to the other end of the inductor, or to the one end of the inductor via a low-pass filter.

Optionally, in case of the second input terminal of the first operational amplifier receiving the predefined voltage, the AC component reconstruction module may further include:

- a first compensation circuit, a terminal of the first compensation circuit coupled to the second end of the inductor, or to the first end of the inductor via a low-pass filter, another terminal of the first compensation circuit coupled to the output terminal of the AC component reconstruction module, the first compensation circuit configured to compensate for a pull-down current for the charge/discharge capacitor generated by the current-controlled current source; and
- a second compensation circuit, a terminal of the second compensation circuit receiving the predefined voltage, another terminal of the second compensation circuit coupled to the output terminal of the AC component reconstruction module, the second compensation circuit configured to compensate for a pull-up current for the charge/discharge capacitor generated by the current-controlled current source.

Optionally, the first compensation circuit may include a second operational amplifier and a second current mirror circuit, a first input terminal of the second operational amplifier coupled to the other end of the inductor, or to the one end of the inductor via a low-pass filter, a second input terminal of the second operational amplifier coupled to a first terminal of the second current mirror circuit, thereby forming a first feedback path, an output terminal of the second operational amplifier coupled to a control terminal of the second current mirror circuit, a second terminal of the second current mirror circuit coupled to the output terminal of the AC component reconstruction module.

Optionally, the second current mirror circuit may include eleventh to fifteenth MOS transistors, a gate of the eleventh MOS transistor coupled to the output terminal of the second operational amplifier, a source of the eleventh MOS transistor serving as the first terminal of the second current mirror circuit, a drain of the eleventh MOS transistor coupled to a drain and a gate of the twelfth MOS transistor and a gate of the thirteenth MOS transistor, a drain of the thirteenth MOS transistor coupled to a drain and a gate of the fourteenth MOS transistor and a gate of the fifteenth MOS transistor, a source of the fourteenth MOS transistor coupled to the source of the eleventh MOS transistor, a drain of the fifteenth MOS transistor serving as the second terminal of the second current mirror circuit.

Optionally, the second compensation circuit may include a third operational amplifier and a third current mirror circuit, a first input terminal of the third operational amplifier receiving the predefined voltage, a second input terminal of the third operational amplifier coupled to a first terminal of the third current mirror circuit, thereby forming a second feedback path, an output terminal of the third operational amplifier coupled to a control terminal of the third current mirror circuit, a second terminal of the third current mirror circuit coupled to the output terminal of the AC component reconstruction module.

Optionally, the third current mirror circuit may include sixteenth to eighteenth MOS transistors, a gate of the sixteenth MOS transistor coupled to the output terminal of the third operational amplifier, a source of the sixteenth MOS transistor serving as the first terminal of the third current mirror circuit, a drain of the sixteenth MOS transistor coupled to a drain and a gate of the seventeenth MOS transistor and a gate of the eighteenth MOS transistor, a drain of the eighteenth MOS transistor serving as the second terminal of the third current mirror circuit, a source of the sixteenth MOS transistor being grounded.

Optionally, the current-controlled current source may include a bias current source and a first current mirror circuit, a control terminal of the first current mirror circuit coupled to the output terminal of the first operational amplifier, a first terminal of the first current mirror circuit coupled to the one end of the inductor, a second terminal of the first current mirror circuit coupled to the one end of the charge/discharge capacitor, a third terminal of the first current mirror circuit coupled to the bias current source, the bias current source configured to provide a corresponding bias current for the first current mirror circuit, the first current mirror circuit configured to charge or discharge the charge/discharge capacitor under the control of a control signal output from the first operational amplifier.

Optionally, the first current mirror circuit may include first to tenth MOS transistors, drains of the first and second MOS transistors coupled together to provide the second terminal of the first current mirror circuit, a gate of the first MOS transistor coupled to a gate and a drain of the ninth MOS transistor and a drain of the eighth MOS transistor, a gate of the second MOS transistor coupled to a gate and a drain of the tenth MOS transistor and a drain of the seventh MOS transistor, a gate of the third MOS transistor serving as the control terminal of the first current mirror circuit, a source of the third MOS transistor coupled to a drain of the sixth MOS transistor to provide the first terminal of the first current mirror circuit, a drain of the third MOS transistor coupled to a drain and a gate of the fourth MOS transistor and a gate of the eighth MOS transistor, gates of the fifth to seventh MOS transistors coupled together, a drain of the fifth MOS transistor serving as the third terminal of the first current mirror circuit, sources of the fifth, sixth, seventh, ninth and first MOS transistors coupled together, sources of the fourth, eighth, tenth and second MOS transistors and the other end of the charge/discharge capacitor coupled together and grounded.

Optionally, the inductor current reconstruction circuit may further include a first resistor coupled between the inductor and the first terminal of the first current mirror circuit, wherein the bias current is greater than the voltage at the other end of the inductor divided by the resistance of the first resistor.

Optionally, the inductor current reconstruction circuit may further include a DC component calibration module, which is coupled to an output terminal of the AC component reconstruction module and configured to calibrate a DC component in the reconstructed signal.

Optionally, the one end of the inductor may be coupled to an upper power transistor and a lower power transistor, wherein the DC component calibration module includes:

a lower transistor detection circuit for detecting, when the lower power transistor is turned on, a current flowing through the lower power transistor and outputting a voltage corresponding to the current through the lower power transistor; and a calibration switch, which is coupled to the lower transistor detection circuit and the output terminal of the AC component reconstruction module and is configured to be turned on over a predetermined period of time before the lower power transistor is turned off to calibrate the voltage output from the lower transistor detection circuit and the reconstructed signal output from the AC component reconstruction module to eliminate a DC component offset in the reconstructed signal.

Optionally, the calibration switch may be turned on at the same phase in each switching period or in every several switching periods of the lower power transistor.

Based on the same inventive concept, the present invention also provides a controller including the inductor current reconstruction circuit described hereinabove.

Based on the same inventive concept, the present invention also provides a switched-mode power supply including an inductor, power transistors and the controller described hereinabove, the controller coupled to a node to which the power transistors and the inductor are coupled.

Compared with the prior art, the present invention has at least one of the following benefits:

1. The inductor current reconstruction circuit includes an AC component reconstruction module having a charge/discharge capacitor, which is coupled to an inductor and configured to charge or discharge the charge/discharge capacitor, based on the voltage difference between voltages at two ends of the inductor, or on the voltage difference between a voltage at one end of the inductor and another voltage associated with the voltage at the one end of the inductor or a predefined voltage. When the voltage difference is positive, the charge/discharge capacitor is charged. Otherwise, if the voltage difference is negative, the charge/discharge capacitor is discharged. Moreover, the charge/discharge capacitor is charged or discharged at a current proportional to the voltage difference (i.e., the charge/discharge capacitor is charged or discharged at a current proportional to the absolute value of the voltage difference), and a reconstructed signal characterizing an AC component in a current through the inductor is output from the AC component reconstruction module. In this way, inductor current reconstruction can be achieved without detecting ON/OFF states of power transistors. This makes the precision of inductor current reconstruction immune from the influence of both any voltage drop across the power transistors and simultaneous turn-off of the upper and lower power transistors that one end of the inductor is coupled to.
2. Even higher precision of inductor current reconstruction can be obtained by additionally providing a DC component calibration module capable of calibrating the output voltage from the AC component reconstruction module over a very short period of time before the lower power transistor is turned off and thereby eliminating a DC offset in the output voltage.

DETAILED DESCRIPTION

Figure 1:
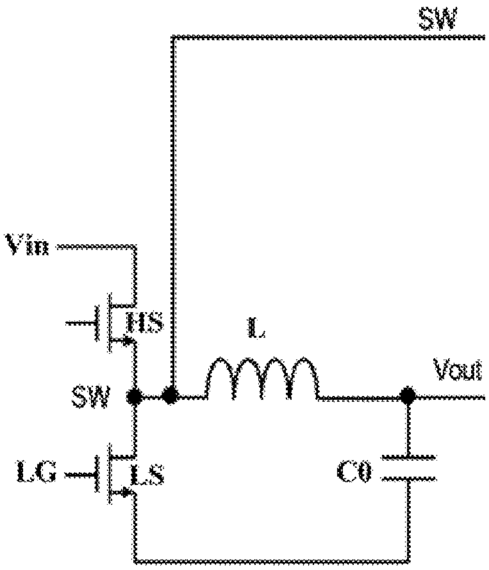
Fig. 1 Prior Art
FIG. 1 is a schematic partial circuit diagram of an existing switched-mode power supply.

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessary obscuring of the invention. It is to be understood that the invention may be embodied in many different forms and should not be construed as being limited to the embodiments set forth below. Rather, these embodiments are provided so that this disclosure is thorough and conveys the scope of the invention to those skilled in the art. In the drawings, like reference numerals refer to like elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

As discussed in the Background section, more and more switched-mode power supplies have begun using a reconstructed inductor current for their control and protection, but existing inductor current reconstruction designs are associated with a number of deficiencies.

Specifically, referring to FIG. 1, a buck switched-mode power supply is shown as an example, in which as a result of turn-on and turn-off actions of an upper power transistor HS and a lower power transistor LS, an input voltage Vin is periodically transmitted to an inductor L and an output capacitor C0, and a direct current (DC) output voltage Vout is obtained across an output capacitor C0. Moreover, the upper power transistor HS and the lower power transistor LS can be alternately turned on and off to increase or decrease a current IL in the inductor L.

A corresponding existing inductor current reconstruction method operates by detecting the ON/OFF states of the upper power transistor HS and the lower power transistor LS and charging or discharging a capacitor (not shown) based on the detection results. An inductor current can be reconstructed as a resultant voltage across the capacitor corresponds to the inductor current. In the buck switched-mode power supply, when the upper power transistor HS is turned on, the capacitor is charged at a current proportional to (Vin−Vout); and when the lower power transistor LS is turned on, the capacitor is discharged at a current proportional to Vout. If the switched-mode power supply is implemented as a boost one, when the upper power transistor HS is turned on, the capacitor will be discharged at a current proportional to (Vout−Vin); and when the lower power transistor LS is turned on, the capacitor will be charged at a current proportional to Vin.

However, as shown in FIG. 1, in the buck switched-mode power supply, when the upper power transistor HS and the lower power transistor LS are both turned off, the reconstructed inductor current will be inaccurate. Moreover, the precision of the reconstructed inductor current will degrade when a current through a node SW to which the upper power transistor HS, the lower power transistor LS and the inductor L are all coupled rises or falls relatively slowly. Further, the accuracy of the reconstructed inductor current can also be affected by any voltage drop across the upper power transistor HS or the lower power transistor LS.

In view of this, the present invention provides an inductor current reconstruction scheme, in which a charge/discharge capacitor is charged or discharged based on the voltage difference between voltages at opposing ends of an inductor, or on the difference between a voltage at one end of the inductor and a voltage associated with the voltage at the end of the inductor. Specially, if the voltage difference is positive, the charge/discharge capacitor is charged. Otherwise, if the voltage difference is negative, the charge/discharge capacitor is discharged. Moreover, a current through the charge/discharge capacitor is proportional to the voltage difference between voltages at the opposing ends of the inductor (i.e., the charge/discharge capacitor is charged or discharged at a current proportional to the absolute value of the voltage difference). In this way, inductor current reconstruction can be achieved without detecting ON (or turn-on, active)/OFF states of the power transistors. This makes the precision of inductor current reconstruction immune from the influence of both simultaneous turn-off of the upper and lower power transistors and any voltage drop across the power transistors.

The present invention will be described in greater detail below with reference to the accompanying drawings by way of specific embodiments. From the following description, advantages and features of the present invention will become more apparent. Note that the figures are provided in a very simplified form not necessarily drawn to exact scale and for the only purpose of facilitating easy and clear description of the disclosed embodiments.

Embodiment 1

Figure 2:
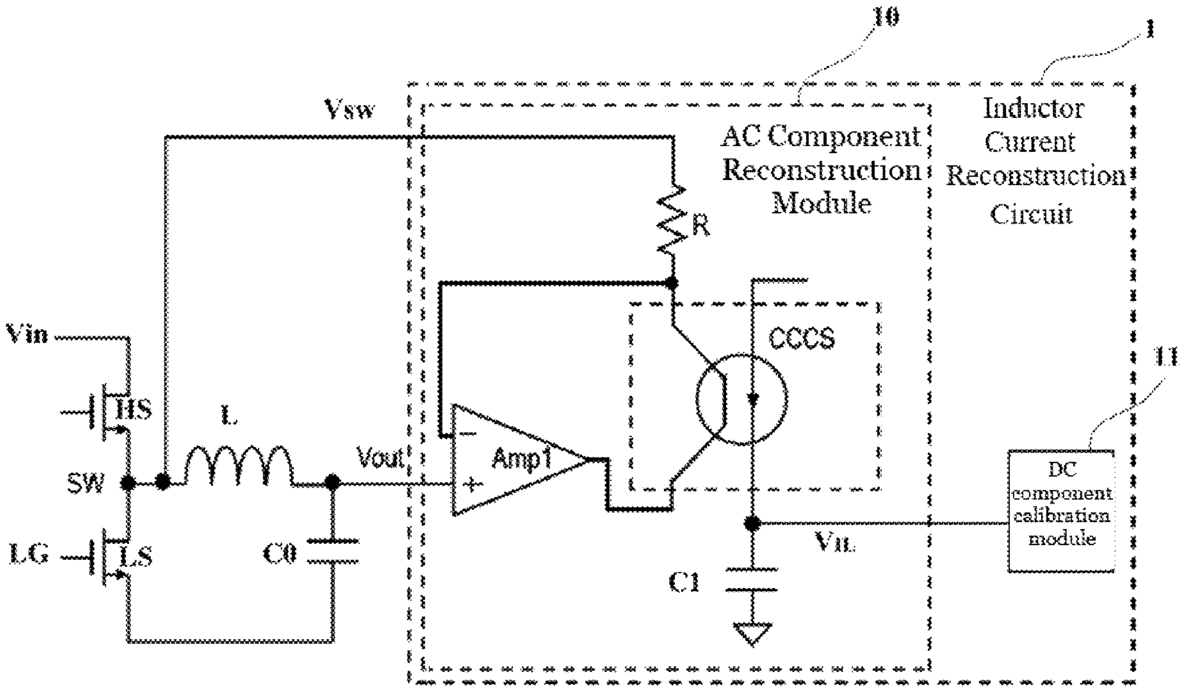
FIG. 2 is a schematic diagram showing an exemplary structure of an inductor current reconstruction circuit according to a first embodiment of the present invention.

Referring to FIG. 2, in a first embodiment, there is provided an inductor current reconstruction circuit 1 used in a switched-mode power supply. It can reconstruct an inductor current IL in the switched-mode power supply. The switched-mode power supply may be of any suitable topology such as buck, boost or buck-boost. For example, the switched-mode power supply includes an upper power transistor HS, a lower power transistor LS, an inductor L and an output capacitor C0. A terminal of the upper power transistor HS and a terminal of the lower power transistor LS are coupled to one end of the inductor L at a node SW, allowing a voltage Vsw to be present at the end of the inductor L. Another terminal of the upper power transistor HS receives an input voltage Vin, and one end of the output capacitor C0 is coupled to the other end of the inductor L, allowing another voltage Vout to be present at the other end of the inductor L (which is also an output voltage of the switched-mode power supply). The other end of the output capacitor C0 is coupled to another terminal of the lower power transistor LS (which is, for example, grounded).

The inductor current reconstruction circuit 1 includes an alternating current (AC) component reconstruction module 10 having a charge/discharge capacitor C1. The AC component reconstruction module 10 is coupled to the inductor L and configured to charge or discharge the charge/discharge capacitor C1 based on the difference Vsw−Vout between the voltages at the two ends of the inductor L. In this way, a voltage across the charge/discharge capacitor C1 can characterize an AC component in a current through the inductor. That is, the AC component reconstruction module 10 can output a reconstructed signal $V_{IL}$ representative of the AC component in the inductor current. This design can be used for inductor current reconstruction in a switched-mode power supply with a Vout interface.

As an example, referring to FIG. 2, the AC component reconstruction module 10 has the charge/discharge capacitor C1, a first operational amplifier Amp1, a first resistor R and a current-controlled current source (CCCS). One end of the first resistor R is coupled to a first terminal of the current-controlled current source CCCS and a first input terminal "−" of the first operational amplifier Amp1, and the other end of the first resistor R is coupled to the end SW of the inductor L to receive the voltage Vsw present at the end. A second input terminal "+" of the first operational amplifier Amp1 is coupled to the other end of the inductor L to receive the voltage Vout present at this end. An output terminal of the first operational amplifier Amp1 is coupled to a control terminal of the current-controlled current source CCCS. A second terminal of the current-controlled current source CCCS is coupled to one end of the charge/discharge capacitor C1 and provides an output terminal of the AC component reconstruction module 10 for outputting the reconstructed signal $V_{IL}$. The other end of the charge/discharge capacitor C1 is grounded. The first resistor R and the charge/discharge capacitor C1 are chosen so that a combination of their resistance and capacitance matches the inductance of the inductor L.

The first operational amplifier Amp1 generates, according to the voltage difference Vsw−Vout between the voltages at the ends of the inductor L, a corresponding control signal (not shown) for controlling the current-controlled current source CCCS to charge or discharge the charge/discharge capacitor C1. When (Vsw−Vout)>0, the current-controlled current source CCCS charges the charge/discharge capacitor C1; and when (Vsw−Vout)<0, the current-controlled current source CCCS discharges the charge/discharge capacitor C1. Through charging or discharging the charge/discharge capacitor C1 by the current-controlled current source CCCS at a current of (Vsw−Vout)/R through the first resistor R created by the first operational amplifier Amp1, the reconstructed signal $V_{IL}$ output from the AC component reconstruction module 10 contains information indicating the AC component in the inductor current.

Figure 3:
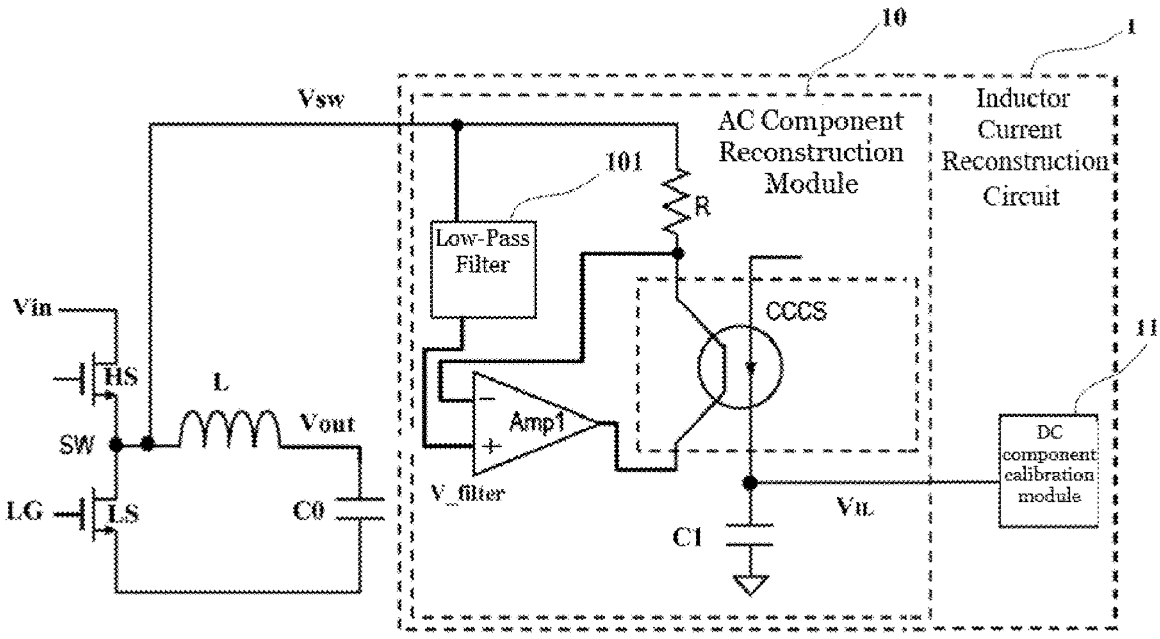
FIG. 3 is a schematic diagram showing another exemplary structure of the inductor current reconstruction circuit according to the first embodiment of the present invention.

As another example, referring to FIG. 3, the AC component reconstruction module 10 has a charge/discharge capacitor C1, a first operational amplifier Amp1, a low-pass filter 101, a first resistor R and a current-controlled current source CCCS. One end of the first resistor R is coupled to a first terminal of the current-controlled current source CCCS and a first input terminal "−" of the first operational amplifier Amp1, and the other end of the first resistor R and a terminal of the low-pass filter 101 are both coupled to the end SW of the inductor L to receive the voltage Vsw at this end of the inductor L. A second input terminal "+" of the first operational amplifier Amp1 is coupled to an output terminal of the low-pass filter 101 to receive a voltage V_filter from the low-pass filter 101 (i.e., a voltage associated with the voltage Vsw at the end of the inductor L). An output terminal of the first operational amplifier Amp1 is coupled to a control terminal of the current-controlled current source CCCS. A second terminal of the current-controlled current source CCCS is coupled to one end of the charge/discharge capacitor C1 and provides an output terminal of the AC component reconstruction module 10 for outputting the reconstructed signal $V_{IL}$. The other end of the charge/discharge capacitor C1 is grounded. The first resistor R and the charge/discharge capacitor C1 are chosen so that a combination of their resistance and capacitance matches the inductance of the inductor L and that the voltage V_filter from the low-pass filter 101 is associated with the voltage Vsw at the end of the inductor L.

In this example, the first operational amplifier Amp1 generates, according to the voltage difference Vsw−V_filter between the voltage Vsw at the end of the inductor L and the voltage V_filter, a corresponding control signal for controlling the current-controlled current source CCCS to charge or discharge the charge/discharge capacitor C1. When (Vsw−V_filter)>0, the current-controlled current source CCCS charges the charge/discharge capacitor C1; and when (Vsw−V_filter)<0, the current-controlled current source CCCS discharges the charge/discharge capacitor C1. Through charging or discharging the charge/discharge capacitor C1 by the current-controlled current source CCCS at a current of (Vsw−V_filter)/R through the first resistor R created by the first operational amplifier Amp1, which characterizes how fast the inductor current IL changes, the reconstructed signal $V_{IL}$ output from the AC component reconstruction module 10 contains information indicating the AC component in the inductor current.

Compared with the example shown in FIG. 2, this example dispenses with the need to use the voltage Vout at the other end of the inductor L as another input signal for inductor current reconstruction circuit 1 and is therefore suitable for use for inductor current reconstruction in a switched-mode power supply without a Vout interface.

In this embodiment, with reference to FIGS. 2 and 3, the inductor current reconstruction circuit 1 additionally includes a DC component calibration module 11, the DC component calibration module 11 is coupled to the output terminal of the AC component reconstruction module 10 and configured to calibrate a DC component in the reconstructed signal $V_{IL}$ from the AC component reconstruction module 10.

The DC component calibration module 11 may employ any suitable circuit design.

Figure 5:
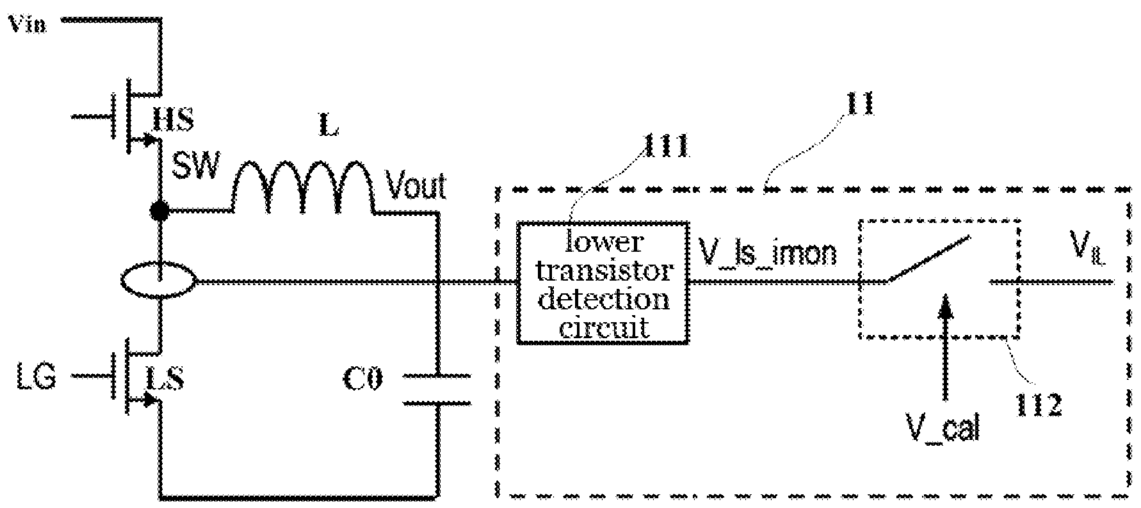
FIG. 5 is a schematic diagram showing an exemplary structure of a DC component calibration module in the inductor current reconstruction circuit according to the first embodiment of the present invention.

For example, referring to FIG. 5, one end of the inductor L in the switched-mode power supply is coupled to the upper power transistor HS and the lower power transistor LS, and the DC component calibration module 11 includes a lower transistor detection circuit 111 and a calibration switch 112. The lower transistor detection circuit 111 is configured to detect a current through the lower power transistor LS when the lower power transistor LS is turned on and output a voltage V_ls_imon corresponding to the current through the lower power transistor LS. The calibration switch 112 is coupled to the lower transistor detection circuit 111 and the output terminal of the AC component reconstruction module 10.

Figure 6:
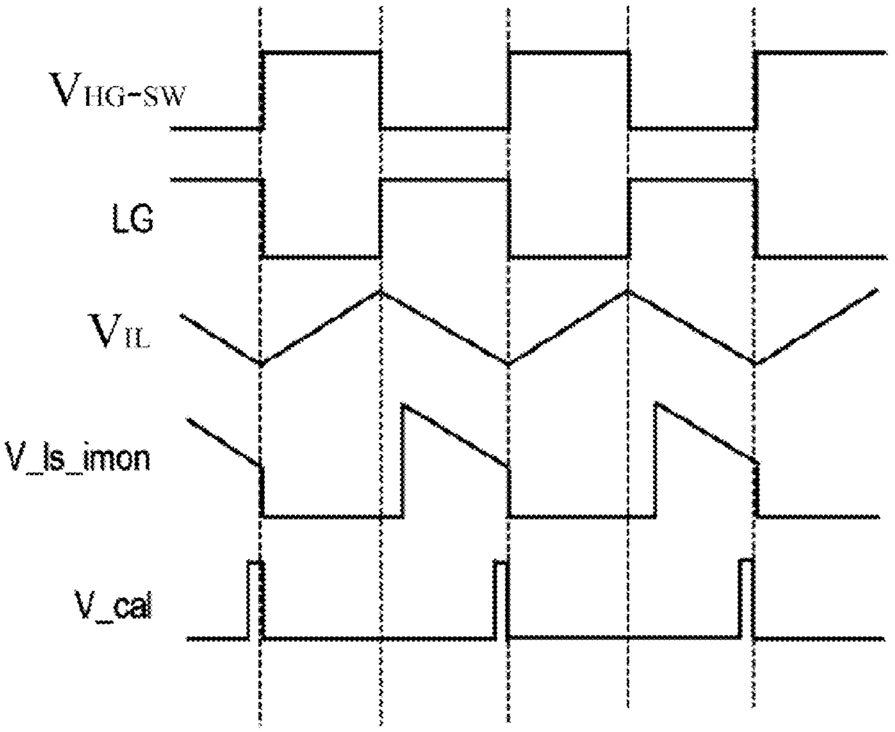
FIG. 6 is a schematic timing diagram of the DC component calibration module in the inductor current reconstruction circuit according to the first embodiment of the present invention.

Referring to FIG. 6, in the switched-mode power supply, the upper power transistor HS and the lower power transistor LS are alternately turned on and off. In response to an LG signal transitioning from a low level to a high level, the lower power transistor LS is turned on (i.e., activated; at this time, the upper power transistor HS is OFF). After a delay due to parasitic parameters of the lower power transistor LS itself and other factors, the lower transistor detection circuit 111 detects the current through the lower power transistor LS and outputs the voltage V_ls_imon. In a following period, the LG signal remains at the high level, the voltage V_ls_imon varies with the current through the lower power transistor LS in the same manner as the reconstructed signal $V_{IL}$ varies with the inductor current (both decrease gradually). When the LG signal transitions from the high level back to the low level, the lower power transistor LS is turned off. In response, the current detected by the lower transistor detection circuit 111 and the voltage V_ls_imon output therefrom both become zero. At this time, the upper power transistor HS is turned on, and the reconstructed signal $V_{IL}$ still varies with the inductor current (gradually increases instead). On the other hand, the calibration switch 112 is turned on when the control signal V_cal transitions from a low level to a high level, and off when the control signal V_cal transitions from the high level back to the low level. The control signal V_cal may be kept at the high level for a very short period of time, and a falling edge of the control signal V_cal may be aligned with a falling edge of the LG signal. In this way, under the control of the control signal V_cal, the calibration switch 112 is ON in a (very short) predetermined period of time before the lower power transistor LS is turned off, calibrating the voltage V_ls_imon output from the lower transistor detection circuit 111 and the reconstructed signal $V_{IL}$ output from the AC component reconstruction module 10 and thereby eliminating any DC component offset in the reconstructed signal $V_{IL}$.

Optionally, the calibration switch 112 may be turned on in each switching period, or at a phase of every several switching periods of the lower power transistor LS.

According to this embodiment, the DC component calibration module 11 enables even higher accuracy and precision of inductor current reconstruction to be achieved. Of course, in other embodiments of the present invention, the DC component calibration module 11 may be omitted, as long as desired accuracy and precision of inductor current reconstruction can be obtained.

The current-controlled current source CCCS in this embodiment may employ any suitable circuit design.

Figure 4:
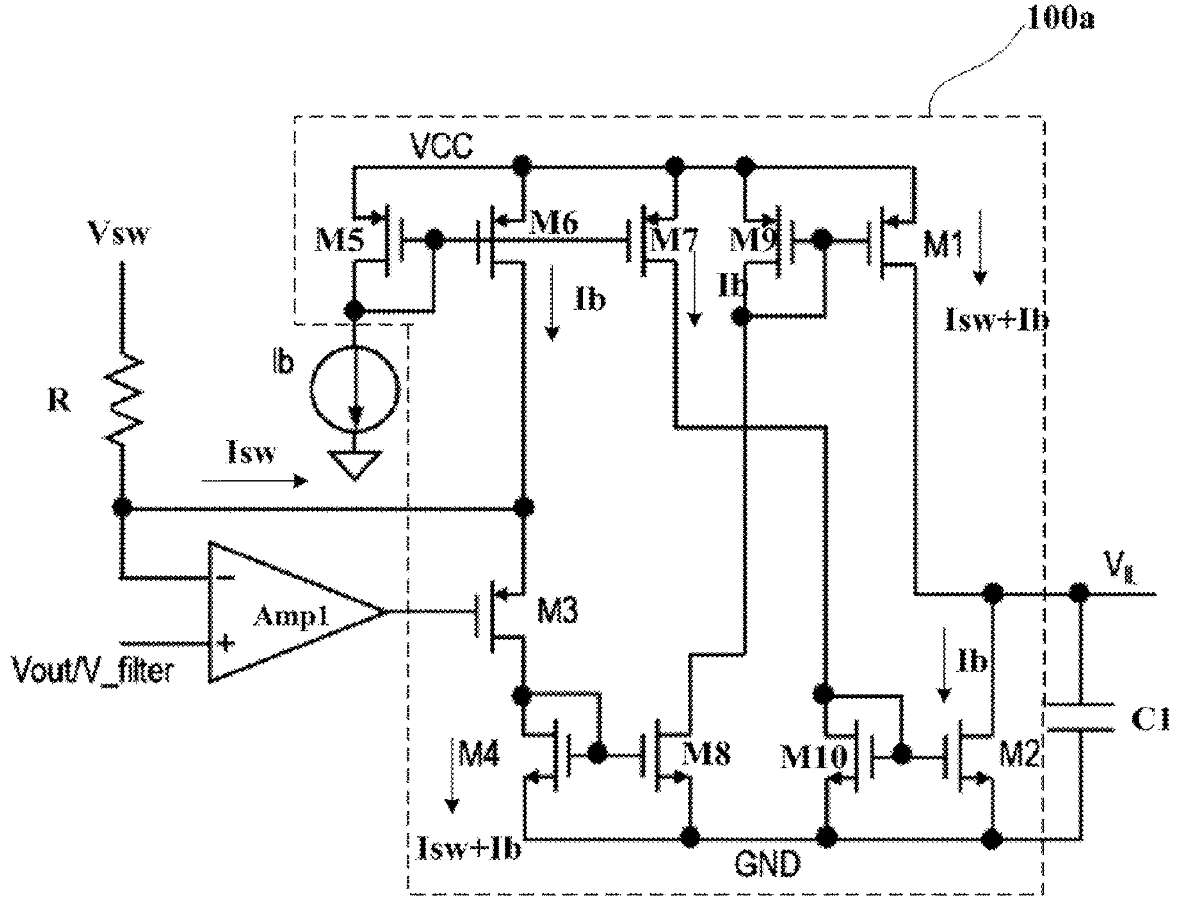
FIG. 4 is a schematic diagram showing an exemplary structure of an AC component reconstruction module in the inductor current reconstruction circuit according to the first embodiment of the present invention.

As an example, with reference to FIGS. 2, 3 and 4, the current-controlled current source CCCS may include a bias current source Ib and a first current mirror circuit 100*a*. In this case, a control terminal of the first current mirror circuit 100*a* is coupled to the output terminal of the first operational amplifier Amp1, and a first terminal of the first current mirror circuit 100*a* (i.e., the source of the MOS transistor M3 in FIG. 4) is coupled to the other end of the first resistor R and hence to the end of the inductor L. Moreover, a second terminal of the first current mirror circuit 100*a* (i.e., the drains of the MOS transistors M2 and M1 in FIG. 4) is coupled to one end of the charge/discharge capacitor C1, and a third terminal of the first current mirror circuit 100*a* (i.e., the drain of the MOS transistor M5 in FIG. 4) is coupled to the bias current source Ib. The bias current source Ib is configured to provide a bias current for the first current mirror circuit 100*a*, and the first current mirror circuit 100*a* is configured to charge or discharge the charge/discharge capacitor C1 according to the control signal (not shown) output from the first operational amplifier Amp1.

It is to be noted that the first current mirror circuit 100*a* in this example may employ any suitable current mirror circuit design, and the present invention is not limited in this regard.

For example, the first current mirror circuit 100*a* includes first to tenth MOS transistors M1-M10, in which the second, fourth, eighth and tenth MOS transistors M2, M4, M8, M10 are all NMOS transistors, and the first, third, fifth to seventh and ninth MOS transistors M1, M3, M5-M7, M9 are all PMOS transistors. For ease of description, the first to tenth MOS transistors M1-M10 may be referred to as the MOS transistors M1-M10 hereinafter.

The MOS transistors in the first current mirror circuit 100*a* are wired in the way described below. Sources of the MOS transistors M1, M5-M7, M9 are coupled together and all receive a power supply voltage VCC. Sources of the MOS transistors M2, M4, M8, M10 are coupled together and all grounded GND. A drain of the MOS transistor M5 serves as the third terminal of the first current mirror circuit 100*a* and is coupled to a terminal of the bias current source Ib. Gates of the MOS transistors M5, M6, M7 are coupled together, and a drain of the MOS transistor M6, a source of the MOS transistor M3 and the other end of the first resistor R are coupled together and together serve as the first terminal of the first current mirror circuit 100*a*. A drain of the MOS transistor M3 is coupled to a drain of the MOS transistor M4, a gate of M4 and a gate of the MOS transistor M8, and a gate of the MOS transistor M3 serves as the control terminal of the first current mirror circuit 100*a* that is coupled to the output terminal of the first operational amplifier Amp1. A drain of the MOS transistor M8 is coupled to a drain of the MOS transistor M9, a gate of M9 and a gate of the MOS transistor M1, a drain of the MOS transistor M7 is coupled to a drain of the MOS transistor M10, a gate of M10 and a gate of the MOS transistor M2. A drain of the MOS transistor M1 and a drain of the MOS transistor M2 are coupled together and together serve as the second terminal of the first current mirror circuit 100*a* that is coupled to one end of the charge/discharge capacitor C1. The MOS transistor M3 functions as a follower of the first operational amplifier Amp1 and can reflect variation in the control signal output from the first operational amplifier Amp1.

Operation of the first current mirror circuit 100*a* is described below.

When the voltage difference ΔV=(Vsw−Vout)>0, or when the voltage difference ΔV=(Vsw−V_filter)>0, it produces a current $I_{SW}$ through the first resistor R toward the source of the MOS transistor M3, where $I_{SW}$=ΔV/R. The bias current Ib output from the bias current source Ib is mirrored in the MOS transistors M5, M6, and the mirrored current flows toward the source of the MOS transistor M3. The resultant current $I_{SW}$+Ib at the source of the MOS transistor M3 is mirrored in the MOS transistors M4, M8, M9, M1, resulting in a pull-up current $I_{SW}$+Ib required for charging of the charge/discharge capacitor C1. Meanwhile, the current Ib from the bias current source Ib is also mirrored in the MOS transistors M5, M7, M10, M2, resulting in a pull-down current Ib required for charging of the charge/discharge capacitor C1. The pull-up and pull-down currents are combined to produce a resultant current $I_{SW}$=ΔV/R at which the charge/discharge capacitor C1 is charged.

Likewise, when the voltage difference ΔV=(Vsw−Vout) <0, or when the voltage difference ΔV=(Vsw−V_filter)<0, it produces a current $I_{SW}$ through the first resistor R from the source of the MOS transistor M3 toward the first resistor R, where $I_{SW}$=|ΔV|/R=−ΔV/R. The bias current Ib output from the bias current source Ib is mirrored in the MOS transistors M5, M6, and the mirrored current flows toward the source of the MOS transistor M3. The resultant current Ib−$I_{SW}$ at the source of the MOS transistor M3 is mirrored in the MOS transistors M4, M8, M9, M1, resulting in a pull-up current Ib−$I_{SW}$ required for discharging of the charge/discharge capacitor C1. Meanwhile, the current Ib from the bias current source Ib is also mirrored in the MOS transistors M5, M7, M10, M2, resulting in a pull-down current Ib required for discharging of the charge/discharge capacitor C1. The pull-up and pull-down currents are combined to produce a resultant current $I_{SW}$=|ΔV|/R at which the charge/discharge capacitor C1 is discharged.

Obviously, when ΔV>0, the first operational amplifier Amp1 and the bias current source Ib work together to cause the first current mirror circuit 100*a* to charge the charge/discharge capacitor C1; and when ΔV<0, the first operational amplifier Amp1 and the bias current source Ib work together to cause the first current mirror circuit 100*a* to discharge the charge/discharge capacitor C1.

In this embodiment, the AC component reconstruction module 10 can operate normally only when Vout or V_filter is higher than voltage threshold, which is related to turn-on voltage thresholds and overdrive voltages of the MOS transistors M3, M4. In FIG. 4, the bias current Ib must be greater than Vout/R.

In other embodiments of the present invention, the first current mirror circuit 100*a* may alternatively have fewer or more MOS transistors. For example, the MOS transistors M4, M8, M9, M1 may be omitted, and the drain of the MOS transistor M3 may be instead coupled to one end of the capacitor C1.

In summary, the inductor current reconstruction circuit according to this embodiment is able to charge or discharge the charge/discharge capacitor based on the voltage difference between the voltages at the opposing ends of the inductor L. It is also able to generate, based on the voltage difference ΔV=Vsw−Vout between the voltages at the two ends of the inductor L, or on the voltage difference ΔV=Vsw−V_Filter between the voltage Vsw at one end of the inductor L and the voltage V_Filter associated with the voltage Vsw, the current (Vsw−Vout)/R or (Vsw−V_filter)/R through the first resistor R, based on which, the current-controlled current source CCCS charges or discharges the charge/discharge capacitor C1 so that the reconstructed signal $V_{IL}$ representative of the AC component in the inductor current is output. In this way, the AC component in the inductor current and hence the inductor current itself can be reconstructed without detecting the ON/OFF states of the upper power transistor HS and the lower power transistor LS. This makes the precision of inductor current reconstruction immune from the influence of both any voltage drop across the upper power transistor HS and the lower power transistor LS and simultaneous turn-off of the upper power transistor HS and the lower power transistor LS that one end of the inductor L is coupled to.

Embodiment 2

Figure 7:
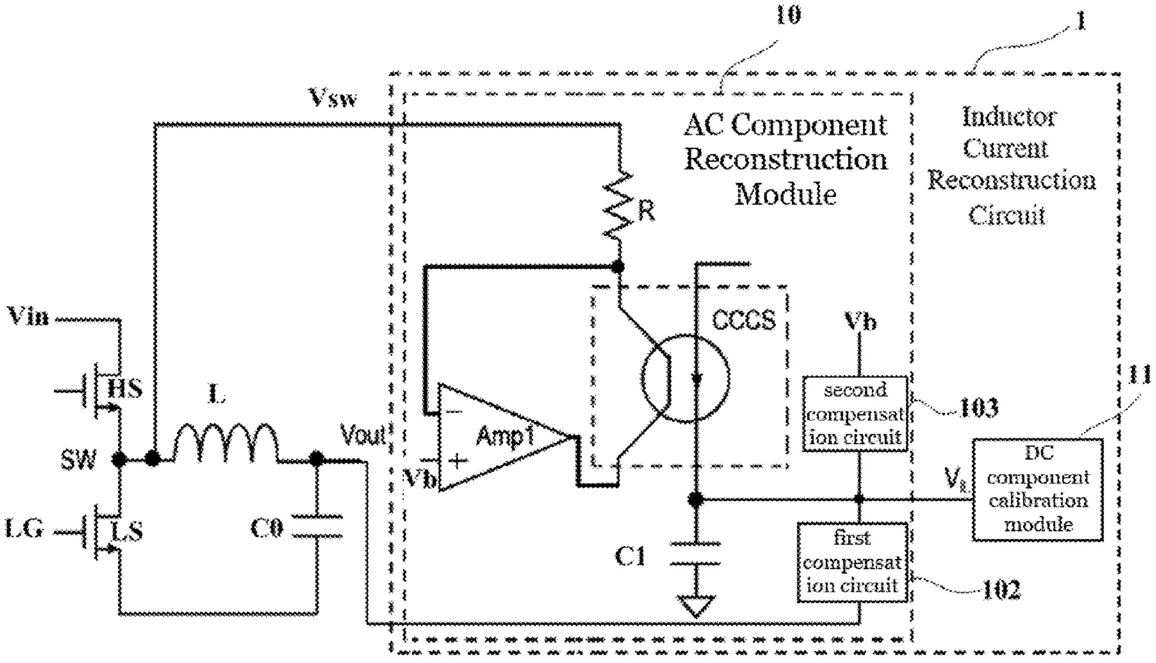
FIG. 7 is a schematic diagram showing an exemplary structure of an inductor current reconstruction circuit according to a second embodiment of the present invention.
Figure 8:
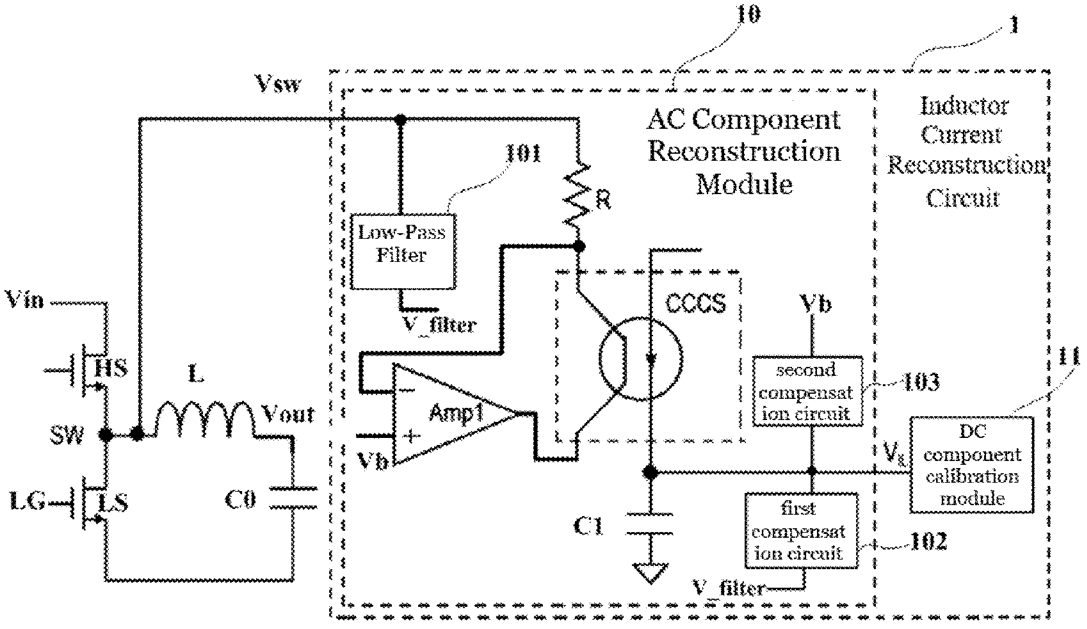
FIG. 8 is a schematic diagram showing another exemplary structure of the inductor current reconstruction circuit according to the second embodiment of the present invention.
Figure 9:
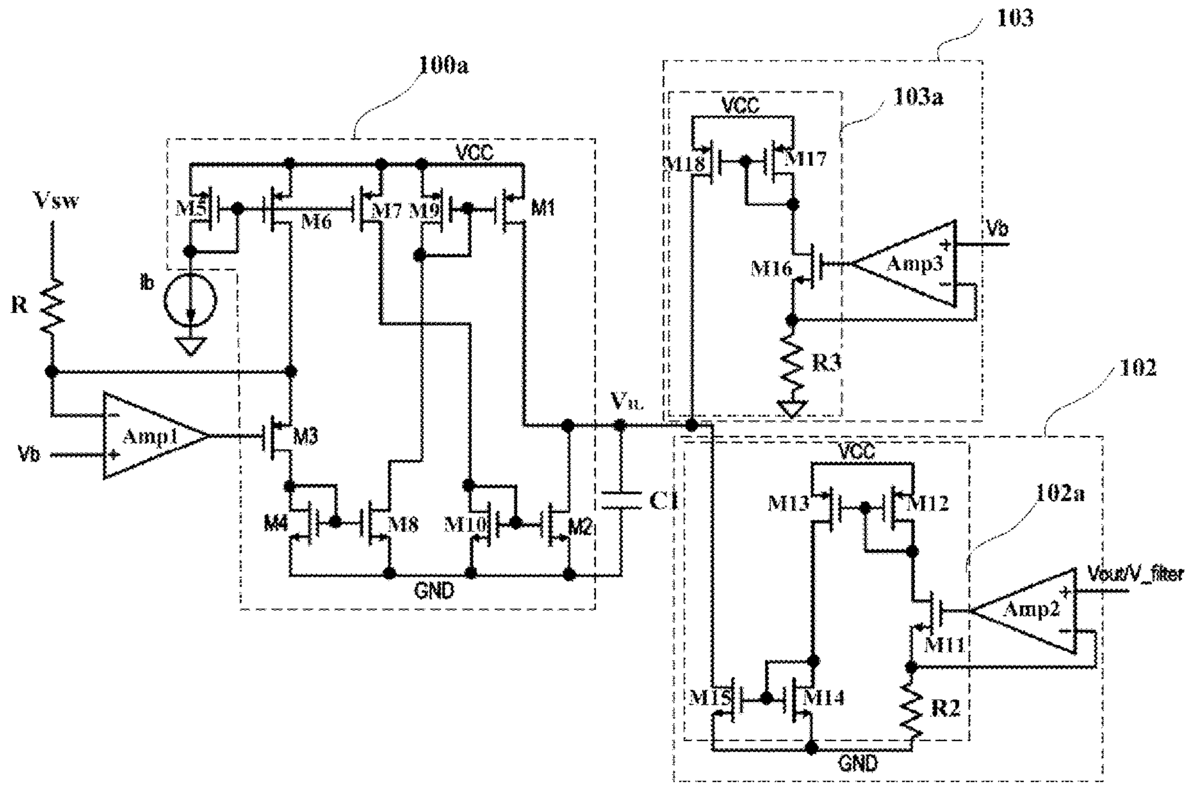
FIG. 9 is a schematic diagram showing an exemplary structure of an AC component reconstruction module in the inductor current reconstruction circuit according to the second embodiment of the present invention.

Referring to FIGS. 7 to 9, in a second embodiment, there is provided an inductor current reconstruction circuit 1, which differs from that of Embodiment 1 in that a second input terminal of a first operational amplifier Amp1 in an AC component reconstruction module 10 in the inductor current reconstruction circuit 1 receives a predefined voltage Vb and in further including a first compensation circuit 102 and a second compensation circuit 103. A terminal of the first compensation circuit 102 is coupled to one end of the inductor L to receive a voltage Vout at this end of the inductor L, as shown in FIG. 7. Alternatively, a terminal of the first compensation circuit 102 is coupled to the other end SW of the inductor L via a low-pass filter 101 to receive a voltage V_filter output from the low-pass filter 101, as shown in FIG. 8.

Another terminal of the first compensation circuit 102 is coupled to an output terminal of the AC component reconstruction module 10. The first compensation circuit 102 is configured to compensate for a pull-down current for a charge/discharge capacitor C1 generated by a current-controlled current source CCCS. A terminal of the second compensation circuit 103 receives a predefined voltage Vb, and another terminal thereof is coupled to the output terminal of the AC component reconstruction module 10. The second compensation circuit 103 is configured to compensate for a pull-up current for the charge/discharge capacitor C1 generated by the current-controlled current source CCCS.

The current-controlled current source CCCS in this embodiment may employ the same circuit design as that of Embodiment 1 and, therefore, needs not be described in further detail herein. Vb is higher than a voltage threshold related to turn-on voltage thresholds and overdrive voltages of MOS transistors M3, M4.

In this embodiment, the first operational amplifier and the current-controlled current source CCCS operate in the same manner as those of Embodiment 1. They can act together to provide a charging or discharging current of (Vsw−Vb)/R for the charge/discharge capacitor C1. The first compensation circuit 102 can provide a pull-down compensation current of Vout/R2 or V_filter/R2 for the charge/discharge capacitor C1, and the second compensation circuit 103 can provide a pull-up compensation current of Vb/R3 for the charge/discharge capacitor C1. Thus, when R, R2 and R3 are equal, the first operational amplifier Amp1, the current-controlled current source CCCS, the first compensation circuit 102 and the second compensation circuit 103 can cooperate to provide a charging or discharging current of |ΔV|/R for the charge/discharge capacitor C1. When ΔV=(Vsw−Vout) or (Vsw−V_Filter) and ΔV>0, the charge/discharge capacitor C1 is charged at a current of ΔV/R, where ΔV/R=(Vsw−Vout)/R or (Vsw−V_Filter)/R. When ΔV=(Vsw−Vout) or (Vsw−V_Filter) and ΔV<0, the charge/ discharge capacitor C1 is discharged at a current of |ΔV|/R=−ΔV/R, where −ΔV/R=(Vout−Vsw)/R or (V_Filter−Vsw)/R.

In this embodiment, with the compensation capabilities of the first compensation circuit 102 and the second compensation circuit 103, the inductor current reconstruction circuit 1 does not require Vout and V_filter to lie in specific ranges. This allows a bias current source Ib to have a reduced size, thereby reducing errors introduced by a current mirror mismatch of the bias current source Ib.

In this embodiment, the first compensation circuit 102 and the second compensation circuit 103 may each employ any suitable circuit design, and the present invention is not limited in this regard.

As an example, with reference to FIGS. 7, 8 and 9, the first compensation circuit 102 includes a second operational amplifier Amp2 and a second current mirror circuit 102*a*. The second current mirror circuit 102*a* includes eleventh to fifteenth MOS transistors M11-M15 (referred to hereinafter as the "MOS transistors M11-M15") and a second resistor R2. The MOS transistors M11, M14, M15 are all NMOS transistors, and the MOS transistors M12, M13 are both PMOS transistors. A first input terminal "+" of the second operational amplifier Amp2 is coupled to the end of the inductor L or to an output terminal of the low-pass filter 101 to receive the voltage Vout or V_Filter. A second input terminal "−" of the second operational amplifier Amp2 is coupled to a source of the MOS transistor M11 (serving as a first terminal of the second current mirror circuit 102*a*) and one end of the second resistor R2, thus forming a first feedback path. An output terminal of the second operational amplifier Amp2 is coupled to a gate of the MOS transistor M11 (serving as a control terminal of the second current mirror circuit 102*a*). A drain of the MOS transistor M11 is coupled to a drain and a gate of the MOS transistor M12 and a gate of the MOS transistor M13. A drain of the MOS transistor M13 is coupled to a drain and a gate of the MOS transistor M14 and a gate of the MOS transistor M15. A drain of the MOS transistor M15 serves as the second terminal of the second current mirror circuit 102 that is coupled to the output terminal of the AC component reconstruction module 10 (and hence to one end of the charge/discharge capacitor C1). The other end of the second resistor R2, a source of the MOS transistor M14 and a source of the MOS transistor M15 are coupled together and grounded. A source of the MOS transistor M12 and a source of the MOS transistor M13 are coupled together and both receive a power supply voltage VCC. The second resistor R2 has the same resistance as the first resistor R. The MOS transistor M11 functions as a follower of the second operational amplifier Amp2, and its outputs follows the voltage Vout/V_filter received at the first input terminal of the second operational amplifier Amp2 and generates a compensation current Vout/R or V_filter/R through the second resistor R2. The compensation current is then mirrored in the MOS transistors M12-M15 and output to one end of the charge capacitor C1, creating a pull-down current Vout/R or V_filter/R for the charge capacitor C1.

As an example, referring to FIGS. 7, 8 and 9, the second compensation circuit 103 includes a third operational amplifier Amp3 and a third current mirror circuit 103*a*. The third current mirror circuit 103*a* includes sixteenth to eighteenth MOS transistors M16-M18 (referred to hereinafter as the "MOS transistors M16-M18") and a third resistor R3. The MOS transistors M17 and M18 are both PMOS transistors, and the MOS transistor M16 is an NMOS transistor. A first input terminal "+" of the third operational amplifier Amp3 receives a predefined voltage Vb, and a second input terminal "−" of the third operational amplifier Amp3 is coupled to a source of the MOS transistor M16 and one end of the third resistor R3 (serving as a first terminal of the third current mirror circuit 103*a*), thereby forming a second feedback path. An output terminal of the third operational amplifier Amp3 is coupled to a gate of the MOS transistor M16 (serving as a control terminal of the third current mirror circuit 103*a*). A drain of the MOS transistor M16 is coupled to a drain and a gate of the MOS transistor 17 and a gate of the MOS transistor 18. A drain of the MOS transistor 18 serves as a second terminal of the third current mirror circuit 103*a* that is coupled to the output terminal of the AC component reconstruction module 10 (and hence to one end of the charge/discharge capacitor C1). The other end of the third resistor R3 is grounded. A source of the MOS transistor M18 and a source of the MOS transistor M17 are coupled together and both receive the power supply voltage VCC. The third resistor R3 has the same resistance as the first resistor R. The MOS transistor M16 functions as a follower of the third operational amplifier Amp3, and its outputs follows the predefined voltage Vb received at the first input terminal of the third operational amplifier Amp3 and generates a compensation current Vb/R through the third resistor R3. The compensation current is then mirrored in the MOS transistors M17-M18 and output to one end of the charge capacitor C1, creating a pull-up current Vb/R for the charge capacitor C1.

It is to be noted that, in other embodiments of the present invention, the second current mirror circuit 102*a* and the third current mirror circuit 103*a* may each have more or fewer MOS transistors while still being able to mirroring the compensation current through the second resistor R2 generated by the second operational amplifier Amp2 and the compensation current through the third resistor R3 generated by the third operational amplifier Amp3 to the end of the charge/discharge capacitor C1. For example, the MOS transistors M12, M13, M14, M15 in the second current mirror circuit 102*a* may be omitted, and the drain of the MOS transistor M11 may be instead coupled to one end of the charge/discharge capacitor C1.

Optionally, in this embodiment, with reference to FIGS. 7 and 8, the inductor current reconstruction circuit 1 may further include a DC component calibration module 11, which is coupled to the output terminal of the AC component reconstruction module 10 and configured to calibrate a DC component in a reconstructed signal $V_{IL}$ output from the AC component reconstruction module 10. The DC component calibration module 11 may employ the circuit design of FIG. 5 or any other suitable circuit design.

In summary, the inductor current reconstruction circuit according to this embodiment is able to charge or discharge the charge/discharge capacitor based on the voltage difference between the voltages at the opposing ends of the inductor L. It is also able to charge or discharge the charge/discharge capacitor C1, based on the voltage difference (Vsw−Vb) between the voltage Vsw at one end of the inductor L and the predefined voltage Vb, at a current of |Vsw−Vb|/R. Moreover, the first compensation circuit can provide a pull-down compensation current of Vout/R2 or V_Filter/R2 for the charge/discharge capacitor C1, and the second compensation circuit can provide a pull-up compensation current of Vb/R3 for the charge/discharge capacitor C1. As such, when R=R2=R3, the charge/discharge capacitor C1 can be changed at a current of (Vsw−Vout)/R or (Vsw−V_Filter)/R and discharged at a current of (Vout−Vsw)/R or (V_Filter−Vsw)/R. In this way, a reconstructed signal $V_{IL}$ representative of an AC component in the inductor current can be output, enabling reconstruction of the AC component in the inductor current. Likewise, the inductor current can be reconstructed without detecting the ON/OFF states of an upper power transistor HS and a lower power transistor LS. This makes the precision of inductor current reconstruction immune from the influence of both any voltage drop across the upper power transistor HS and the lower power transistor LS and simultaneous turn-off of the upper power transistor HS and the lower power transistor LS that one end of the inductor L is coupled to. Further, Vout and V_Filter do not have to lie within specific ranges, allowing the bias current source Ib to have a reduced size and thereby reducing errors introduced by a current mirror mismatch of the bias current source Ib.

Embodiment 3

Referring to FIGS. 2 to 9, in a third embodiment, there is provided a controller (not shown) including the inductor current reconstruction circuit 1 as defined in any of the foregoing embodiments of the present invention.

Since this controller adopts the inventive inductor current reconstruction circuit 1, when used for output control of a switched-mode power supply, it can make the precision of inductor current reconstruction immune from the influence of both simultaneous turn-off of upper and lower power transistors and any voltage drop across the upper and lower power transistors. This enables the switched-mode power supply to have improved control reliability and increased protection ability.

Referring to FIGS. 2 to 9, in an embodiment of the present invention, there is provided a switched-mode power supply including an inductor L, power transistors and the controller including the inductor current reconstruction circuit 1 according to the third embodiment. The controller is coupled to a node SW that the power transistors and the inductor L are coupled to.

The switched-mode power supply may be of any suitable topology such as buck, boost or buck-boost. For example, the switched-mode power supply may include an upper power transistor HS, a lower power transistor LS, the inductor L and an output capacitor C0. A terminal of the upper power transistor HS and a terminal of the lower power transistor LS are coupled to one end of the inductor L at the node SW, allowing a voltage Vsw to be present at the end of the inductor L. Another terminal of the upper power transistor HS receives an input voltage Vin, and one end of the output capacitor C0 is coupled to the other end of the inductor L, allowing another voltage Vout to be present at the other end of the inductor L (which is also an output voltage of the switched-mode power supply). The other end of the output capacitor C0 is coupled to another terminal of the lower power transistor LS (which is, for example, grounded).

Since the switched-mode power supply adopts the inventive controller incorporating the inventive inductor current reconstruction circuit 1, it has improved performance.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. An inductor current reconstruction circuit, comprising an alternating current (AC) component reconstruction module having a charge/discharge capacitor, the AC component reconstruction module coupled to an inductor and configured to charge or discharge the charge/discharge capacitor, based on a first voltage difference between voltages at first and second ends of the inductor, or on a second voltage difference between the voltage at the first end of the inductor and another voltage associated with the voltage at the first end of the inductor, a current of charging or discharging the charge/discharge capacitor proportional to the first or second voltage difference, the AC component reconstruction module outputting a reconstructed signal characterizing an AC component in a current through the inductor, wherein the AC component reconstruction module also has a current-controlled current source, a first terminal of the current-controlled current source coupled to the first end of the inductor, a second terminal of the current-controlled current source coupled to a first end of the charge/discharge capacitor and serving as an output terminal of the AC component reconstruction module, and wherein based on the first voltage difference or on the second voltage difference, the current-controlled current source provides a charge current or a discharge current to the charge/discharge capacitor.

2. The inductor current reconstruction circuit of claim 1, wherein the AC component reconstruction module also has a first operational amplifier, a first input terminal of the first operational amplifier coupled to the first end of the inductor and receiving the voltage at the first end of the inductor, a second input terminal of the first operational amplifier receiving the voltage at the second end of the inductor, or the other voltage associated with the voltage at the first end of the inductor, or a predefined voltage, an output terminal of the first operational amplifier coupled to a control terminal of the current-controlled current source, the reconstructed signal is output from the output terminal of the AC component reconstruction module, a second end of the charge/discharge capacitor being grounded, wherein the first operational amplifier generates, based on the first voltage difference between the voltages at the first and second ends of the inductor, or on the second voltage difference between the voltage at the first end of the inductor and the other voltage associated with the voltage at the first end of the inductor, a corresponding control signal for controlling the magnitude of the charge current or the discharge current provided by the current-controlled current source to the charge/discharge capacitor.

3. The inductor current reconstruction circuit of claim 2, wherein the second input terminal of the first operational amplifier is coupled to the second end of the inductor, or wherein the second input terminal of the first operational amplifier is coupled to the first end of the inductor via a low-pass filter.

4. The inductor current reconstruction circuit of claim 2, wherein in a case of the second input terminal of the first operational amplifier receiving the predefined voltage, the AC component reconstruction module further comprises:

a first compensation circuit, a terminal of the first compensation circuit coupled to the second end of the inductor, or to the first end of the inductor via a low-pass filter, another terminal of the first compensation circuit coupled to the output terminal of the AC component reconstruction module, the first compensation circuit configured to compensate for a pull-down current for the charge/discharge capacitor generated by the current-controlled current source; and a second compensation circuit, a terminal of the second compensation circuit receiving the predefined voltage, another terminal of the second compensation circuit coupled to the output terminal of the AC component reconstruction module, the second compensation circuit configured to compensate for a pull-up current for the charge/discharge capacitor generated by the current-controlled current source.

5. The inductor current reconstruction circuit of claim 4, wherein the first compensation circuit comprises a second operational amplifier and a second current mirror circuit, a first input terminal of the second operational amplifier coupled to the second end of the inductor, or to the first end of the inductor via a low-pass filter, a second input terminal of the second operational amplifier coupled to a first terminal of the second current mirror circuit, thereby forming a first feedback path, an output terminal of the second operational amplifier coupled to a control terminal of the second current mirror circuit, a second terminal of the second current mirror circuit coupled to the output terminal of the AC component reconstruction module.

6. The inductor current reconstruction circuit of claim 5, wherein the second current mirror circuit comprises eleventh to fifteenth MOS transistors, a gate of the eleventh MOS transistor coupled to the output terminal of the second operational amplifier, a source of the eleventh MOS transistor serving as the first terminal of the second current mirror circuit, a drain of the eleventh MOS transistor coupled to a drain and a gate of the twelfth MOS transistor and a gate of the thirteenth MOS transistor, a drain of the thirteenth MOS transistor coupled to a drain and a gate of the fourteenth MOS transistor and a gate of the fifteenth MOS transistor, a source of the fourteenth MOS transistor coupled to the source of the eleventh MOS transistor, a drain of the fifteenth MOS transistor serving as the second terminal of the second current mirror circuit.

7. The inductor current reconstruction circuit of claim 5, wherein the second compensation circuit comprises a third operational amplifier and a third current mirror circuit, a first input terminal of the third operational amplifier receiving the predefined voltage, a second input terminal of the third operational amplifier coupled to a first terminal of the third current mirror circuit, thereby forming a second feedback path, an output terminal of the third operational amplifier coupled to a control terminal of the third current mirror circuit, a second terminal of the third current mirror circuit coupled to the output terminal of the AC component reconstruction module.

8. The inductor current reconstruction circuit of claim 7, wherein the third current mirror circuit comprises sixteenth to eighteenth MOS transistors, a gate of the sixteenth MOS transistor coupled to the output terminal of the third operational amplifier, a source of the sixteenth MOS transistor serving as the first terminal of the third current mirror circuit, a drain of the sixteenth MOS transistor coupled to a drain and a gate of the seventeenth MOS transistor and a gate of the eighteenth MOS transistor, a drain of the eighteenth MOS transistor serving as the second terminal of the third current mirror circuit, a source of the sixteenth MOS transistor being grounded.

9. The inductor current reconstruction circuit of claim 1, wherein the current-controlled current source comprises a bias current source and a first current mirror circuit, a control terminal of the first current mirror circuit coupled to the output terminal of the first operational amplifier, a first terminal of the first current mirror circuit coupled to the first end of the inductor, a second terminal of the first current mirror circuit coupled to the first end of the charge/discharge capacitor, a third terminal of the first current mirror circuit coupled to the bias current source, the bias current source configured to provide a corresponding bias current for the first current mirror circuit, the first current mirror circuit configured to charge or discharge the charge/discharge capacitor under the control of a control signal output from the first operational amplifier.

10. The inductor current reconstruction circuit of claim 9, wherein the first current mirror circuit comprises first to tenth MOS transistors, drains of the first and second MOS transistors coupled together to provide the second terminal of the first current mirror circuit, a gate of the first MOS transistor coupled to a gate and a drain of the ninth MOS transistor and a drain of the eighth MOS transistor, a gate of the second MOS transistor coupled to a gate and a drain of the tenth MOS transistor and a drain of the seventh MOS transistor, a gate of the third MOS transistor serving as the control terminal of the first current mirror circuit, a source of the third MOS transistor coupled to a drain of the sixth MOS transistor to serve as the first terminal of the first current mirror circuit, a drain of the third MOS transistor coupled to a drain and a gate of the fourth MOS transistor and a gate of the eighth MOS transistor, gates of the fifth to seventh MOS transistors coupled together, a drain of the fifth MOS transistor serving as the third terminal of the first current mirror circuit, sources of the fifth, sixth, seventh, ninth and first MOS transistors coupled together, sources of the fourth, eighth, tenth and second MOS transistors and the second end of the charge/discharge capacitor coupled together and grounded.

11. The inductor current reconstruction circuit of claim 9, further comprising a first resistor coupled between the inductor and the first terminal of the first current mirror circuit, wherein the corresponding bias current is greater than a ratio of the voltage at the second end of the inductor to a resistance value of the first resistor.

12. The inductor current reconstruction circuit of claim 1, further comprising a direct current (DC) component calibration module, which is coupled to an output terminal of the AC component reconstruction module and configured to calibrate a DC component in the reconstructed signal.

13. The inductor current reconstruction circuit of claim 12, wherein the first end of the inductor is coupled to an upper power transistor and a lower power transistor, and wherein the DC component calibration module comprises:

a lower transistor detection circuit configured to detect a current flowing through the lower power transistor when the lower power transistor is turned on and output a voltage corresponding to the current flowing through the lower power transistor; and a calibration switch coupled to the lower transistor detection circuit and the output terminal of the AC component reconstruction module, the calibration switch configured to be turned on over a predetermined period of time before the lower power transistor is turned off to calibrate the voltage output from the lower transistor detection circuit and the reconstructed signal output from the AC component reconstruction module, thereby eliminating a DC component offset in the reconstructed signal.

14. The inductor current reconstruction circuit of claim 13, wherein the calibration switch is turned on in each switching period or at a phase in every several switching periods of the lower power transistor.

15. A controller comprising the inductor current reconstruction circuit of claim 1.

16. A switched-mode power supply comprising the inductor, power transistors and the controller of claim 15, the controller coupled to a node to which the power transistors and the inductor are coupled.

* * * * *